(12) United States Patent
Carty et al.

(10) Patent No.: US 10,742,025 B2
(45) Date of Patent: Aug. 11, 2020

(54) METHOD FOR DETECTING AND ISOLATING AN ELECTROMAGNETIC PULSE FOR PROTECTION OF A MONITORED INFRASTRUCTURE

(71) Applicants: Timothy A Carty, Waverly, KS (US); Gregory Wayne Clarkson, Waverly, KS (US)

(72) Inventors: Timothy A Carty, Waverly, KS (US); Gregory Wayne Clarkson, Waverly, KS (US)

(*) Notice: Subject to any disclaimer, the term of this patent is extended or adjusted under 35 U.S.C. 154(b) by 0 days.

(21) Appl. No.: 16/597,427

(22) Filed: Oct. 9, 2019

(65) Prior Publication Data

US 2020/0044441 A1   Feb. 6, 2020

Related U.S. Application Data

(63) Continuation of application No. 16/240,897, filed on Jan. 7, 2019, now Pat. No. 10,530,151.

(60) Provisional application No. 62/615,159, filed on Jan. 9, 2018.

(51) Int. Cl.
*H02H 9/04* (2006.01)
*H02H 5/00* (2006.01)

(52) U.S. Cl.
CPC ............ *H02H 9/045* (2013.01); *H02H 5/005* (2013.01)

(58) Field of Classification Search
CPC ........ G05F 1/571; H01C 7/10; H02H 1/0007; H02H 1/04; H02H 3/023; H02H 3/08; H02H 3/105; H02H 3/16; H02H 3/162; H02H 3/20; H02H 3/22; H02H 3/33; H02H 3/331; H02H 3/338; H02H 3/50; H02H 3/52; H02H 5/005; H02H 7/04; H02H 7/0455; H02H 7/09; H02H 7/1252; H02H 7/26; H02H 9/00; H02H 9/005; H02H 9/04; H02H 9/045; H02H 9/046; H02H 9/08
See application file for complete search history.

(56) References Cited

U.S. PATENT DOCUMENTS

| | | | | |
|---|---|---|---|---|
| 4,669,027 A * | 5/1987 | Elsner | ...................... | H02H 9/06 361/111 |
| 8,305,903 B1 * | 11/2012 | Louise | .................... | G06F 15/00 370/241 |
| 9,562,938 B2 * | 2/2017 | Cox | ................... | G01R 29/0878 |
| 10,530,151 B2 * | 1/2020 | Carty | ..................... | H02H 5/005 |

(Continued)

*Primary Examiner* — Thienvu V Tran
*Assistant Examiner* — Nicolas Bellido
(74) *Attorney, Agent, or Firm* — Dale J. Ream

(57) ABSTRACT

A system and method for detecting and isolating an electromagnetic pulse ("EMP") along first phase, second phase, and third phase electrical lines electrically connected to a monitored infrastructure so as to protect the monitored infrastructure, the method for detecting and isolating includes a phase unit receiving electric signal data from a sensor electrically connected individually to each of the first phase, second phase, and third phase electrical lines, respectively, upstream of and associated with the monitored infrastructure. The method includes determining if the received electric signal data associated with the respective electrical line is indicative of an E1 component of an EMP and, if so, actuating an isolation subsystem in less than 300 nanoseconds to electrically isolate the respective electrical line against electrical communication with the monitored infrastructure.

26 Claims, 14 Drawing Sheets

(56) References Cited

U.S. PATENT DOCUMENTS

| | | | |
|---|---|---|---|
| 2012/0019962 A1* | 1/2012 | Faxvog | H02H 7/0455 |
| | | | 361/1 |
| 2012/0019965 A1* | 1/2012 | Faxvog | H02H 3/52 |
| | | | 361/42 |
| 2016/0126738 A1* | 5/2016 | Moore | H02J 3/18 |
| | | | 361/35 |
| 2016/0231367 A1* | 8/2016 | Cox | G01R 29/0878 |

* cited by examiner

METHOD FOR DETECTING AND ISOLATING AN ELECTROMAGNETIC PULSE FOR PROTECTION OF A MONITORED INFRASTRUCTURE

REFERENCE TO RELATED APPLICATIONS

This application claims the priority of non-provisional patent application Ser. No. 16/240,897 filed Jan. 7, 2019, titled System and Method For Suppressing Electromagnetic Pulse-Induced Electrical System Surges, which claims the benefit of U.S. provisional patent application Ser. No. 62/615,159 filed Jan. 9, 2018 titled System and Method For Suppressing Electromagnetic Pulse-Induced Electrical System Surges and both of which are incorporated in their entirety herein by reference.

BACKGROUND OF THE INVENTION

This invention relates generally to monitoring an electrical wire and detecting an electromagnetic pulse (EMP) and isolating said pulse to prevent electrical damage to an infrastructure such as an electrical grid, commercial facility, or the like.

An electromagnetic pulse, or EMP, can be generally characterized as a short term burst of electromagnetic radiation generated by either natural or man-made activities. Most commonly, however, the term "EMP" is used to specifically describe the electromagnetic burst generated in association with the detonation of a nuclear weapon. Thus, the term "EMP" as used herein refers to the electromagnetic pulse generated by a weapon such as a nuclear weapon or a non-nuclear EMP event such as a mass solar ejection.

The EMP from such a weapon is capable of inducing voltages and corresponding currents into electrical systems such as wide-area power distribution grids, as well as into the electrical systems of homes, commercial buildings, and even vehicle electrical systems. Unless detected, monitored, isolated, or suppressed, that unwanted induced current can damage or destroy components within the affected electrical systems, diminishing the operability of the electrical system or oftentimes rendering it unusable until repaired. Similarly, it is understood that a massive solar event may create a similar electrical catastrophe. For instance, a coronal mass ejection is a sun eruption of super-hot plasma that spews charged particles across the solar system and may induce over-currents in the electrical grid, overheating of transformers, and cause mass failure within the electrical grid.

Unlike the electromagnetic radiation or pulse associated with common phenomena, the EMP generated by a nuclear weapon comprises multiple pulses of varying duration, such that the EMP is more accurately considered as a complex, electromagnetic multi-pulse, usually described in terms of three primary components defined by the International Electrotechnical Commission (IEC) as E1, E2, and E3.

Before an EMP can be handled, it must be detected very quickly and then dealt with before the detected pulse can cause damage to commercial infrastructure, such as to an electrical grid, commercial facility, transformer, or even to a home's electrical panel. Specifically, the dangerous or damaging EMP may be detected, isolated, monitored, or even shunted as will be described later.

While surge suppressors for electrical systems are known in the art, those suppressors are typically optimized for use only with surges of relatively short duration caused by commonly occurring phenomena, such as lightning strikes or electrical system failures (e.g., the failure of a transformer in the power distribution grid or a short introduced across electrical lines). Those known surge suppressors, however, are generally ineffective against the complex, multiple surges caused or generated by a weapon-induced EMP pulse.

Optimally the combination of E1, E2, and E3 components of an EMP needs to be suppressed. However, the present invention recognizes that detection of only the E2 and/or E3 components in the absence of an E1 component may cause a false alarm that a dangerous and true EMP event is occurring and, in such a case, could mistakenly or prematurely, result in the isolation or complete shutdown of important infrastructure that is being monitored. The prior art, including U.S. Pat. No. 9,562,938, disclose embodiments of a system and method for detecting and characterizing electromagnetic pulses for the protection of critical infrastructure components. Although presumably effective for their intended purposes, the prior art does not yet provide a solution in the form of a system and method for detecting, isolating, and monitoring electromagnetic pulse-induced electrical system surges induced by the E1, E2, and E3 components of an electromagnetic radiation complex multi-pulse generated by the detonation of a nuclear weapon.

Thus, because of the complex nature of an EMP pulse, comprised of E1, E2, and E3 components, there remains a need for an improved and total solution, system, and method for electrical surges generated by an EMP promulgated from a detonated nuclear weapon or solar mass ejection. Therefore, it would be desirable to have a system and method for detecting, isolating, and monitoring electromagnetic pulse-induced electrical system surges induced by the E1, E2, and E3 components of an electromagnetic radiation complex multi-pulse generated by the detonation of a nuclear weapon. In addition, the total solution described herein may also include suppressing a combination of an E1, E2, and E3 pulse.

SUMMARY OF THE INVENTION

Embodiments of the invention are defined by the claims below and not solely by this summary. A high-level overview of various aspects of the invention are provided here for that reason, to provide an overview of the disclosure, and to introduce a selection of concepts that are further described in the Detailed Description section below. This summary is not intended to identify key features or essential features of the claimed subject matter, nor is it intended to be used as an aid in isolation to determine the scope of the claimed subject matter. In brief, this disclosure describes, among other things, a system and method for detecting, monitoring, isolating, electromagnetic pulse-induced electrical system surges induced by the E1, E2, and E3 components of an electromagnetic radiation complex multi-pulse generated by the detonation of a nuclear weapon.

In one aspect, electrical signals upstream from a protected infrastructure are continuously collected and monitored so as to determine (1) if an E1 component of an EMP is being experienced and if the infrastructure needs to be protected by immediately isolating the detected pulse or (2) if the monitored signals simply need to be monitored further, i.e. until other characteristics are detected that change the initial determination or call for immediate isolation and protection of the respective infrastructure. For instance, the present invention includes a module referred to as Detection, Isolation, and Monitoring of EMP, or by the acronym DIME. The DIME may also be referred to as a phase unit or a base unit as will be described later.

DIME refers to an EMP protection device capable of isolating protected equipment and infrastructure. Implemented with proprietary fixed logic the DIME is immune to cyber security threats. The proprietary fixed logic of the DIME can identify the signature of an EMP E1 pulse in less than 10 nanoseconds. Upon positive signature detection, the proprietary fixed logic of the DIME provides an isolation signal in less than 300 nanoseconds to ensure protection for the connected equipment (referred to herein as the "protected infrastructure") prior to the E2 and E3 phases of the EMP event.

The DIME monitors low level EMP events by continuously gathering the input signal data and transmitting to a centralized location for post processing. Post processing of multiple DIMEs provides triangulation for location identification of the low level EMP source. This capability can be used to identify targets building EMP weapons systems.

For instance, if the monitored and collected signal data is indicative of an E1 component of an EMP, then a signal is sent to actuate immediate and physical isolation and protection of the infrastructure from which the signal was being monitored. However, if the E1 component is not indicated, such as if only an E2 or E3 component is indicated (or if no surge whatsoever), then collected signals are just monitored but no isolation is actuated. The means for collecting, monitoring, and transmitting signals will be discussed in detail later.

In another aspect of the total EMP solution, the system and method according to the present invention may determine that the monitored infrastructure needs to suppress the electromagnetic pulse-induced electrical system surges that are detected, the system comprising a plurality of shunts placed between, and in electrical communication with, a plurality of power lines in an electrical system, such that a voltage differential between electrical power lines that exceeds a predetermined level is shunted by at least one of the plurality of shunts to prevent the voltage differential from exceeding a desired level.

In this suppression aspect, the response time of the plurality of shunts and the allowable differential voltage level of the shunts are selected and combined to achieve a desired response time and protection level to react to the E1, E2, and E3 components of a complex multi-pulse EMP pulse generated by detonation of a nuclear weapon.

In a further aspect regarding suppression, the system and method protect line-to-line, line-to-neutral, neutral to ground, and line-to-ground arrangements of an electrical system's power lines, as well as combinations and subcombinations thereof. In this regard, the system and method of the present invention are configured to protect single-phase and three-phase land-based electrical systems, in further alternative embodiments the system and method are configured for use on the electrical systems of vehicles, such as automobiles, trucks, locomotives, boats, aircraft and other vehicles employing on-board electrical systems.

BRIEF DESCRIPTION OF THE DRAWINGS

Illustrative embodiments of the invention are described in detail below with reference to the attached drawing figures, and wherein.

DESCRIPTION OF THE PREFERRED EMBODIMENT

Figure 1:
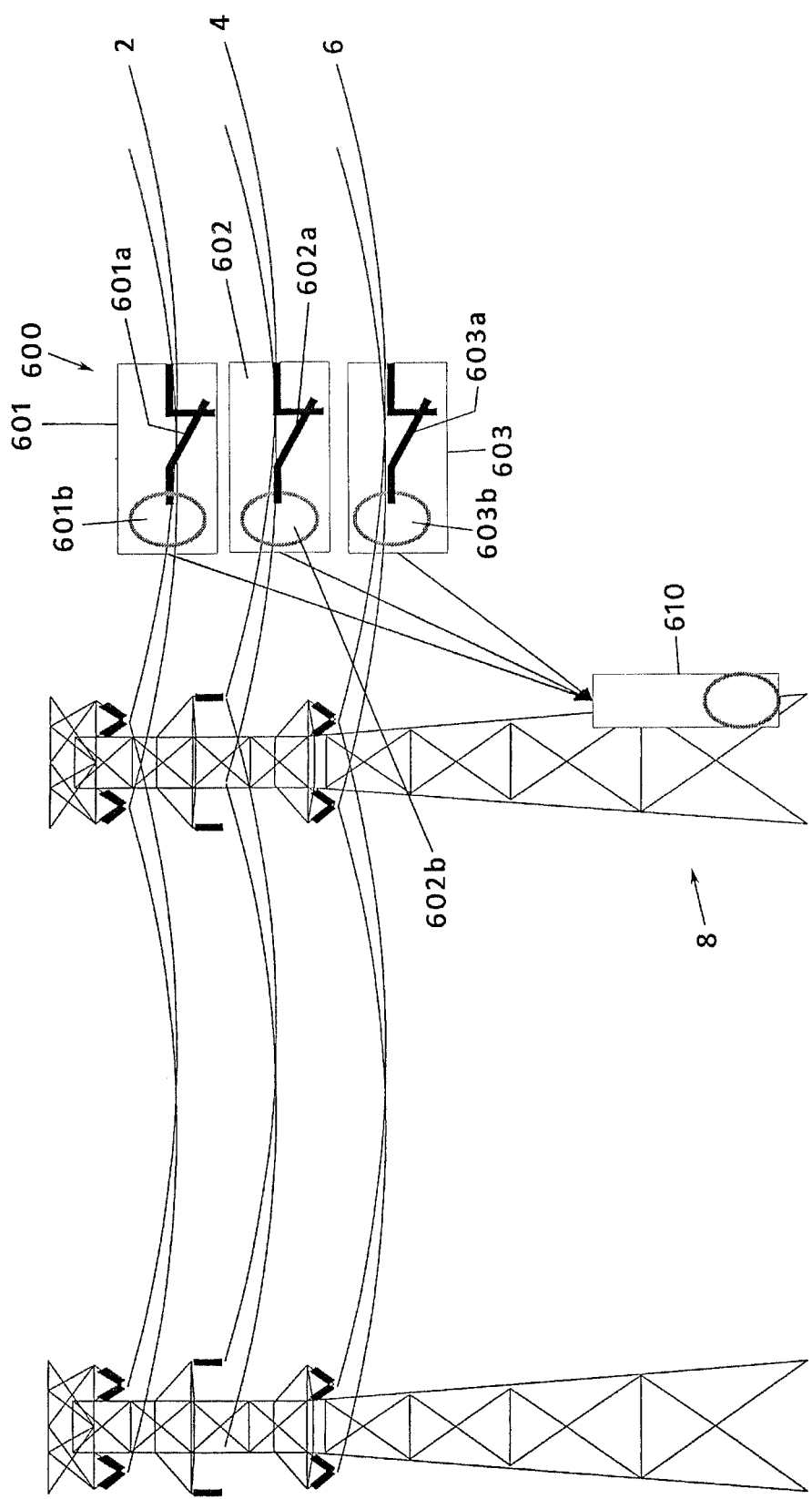
FIG. 1 is a perspective view of a system for detecting and isolating an electromagnetic pulse according to an exemplary embodiment of the present invention.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

Before the present invention regarding detecting, isolating, and monitoring an electromagnetic pulse so as to protect a monitored infrastructure can be described in detail and in context, a deeper understanding of the characteristics of an EMP will be discussed in the context of traditional electrical environments and setups.

As initially presented above, an EMP generated by detonation of a nuclear weapon comprises multiple pulses of varying duration, such that the EMP is more accurately considered as a complex, electromagnetic multi-pulse, usually described in terms of three primary components defined by the International Electrotechnical Commission (IEC) as E1, E2, and E3. The nature of these pulses is described below.

The E1 component of the complex multi-pulse is produced when gamma radiation from the nuclear detonation knocks electrons out of the atoms in the upper atmosphere. The electrons begin to travel in a generally downward direction at relativistic speeds (i.e., at more than 90 percent of the speed of light). In the absence of a magnetic field, the displaced electrons would produce a large pulse of electric current vertically in the upper atmosphere over the entire affected area. However, the Earth's magnetic field acts on the electrons to change the direction of electron flow so that it is at a right angle to the geomagnetic field. This interaction of the Earth's magnetic field and the downward electron flow produces a very large, but very brief, electromagnetic pulse over the affected area.

The process of gamma rays knocking electrons from the atoms in the mid-stratosphere ionizes that region, causing it to become an electrical conductor, that ionization blocking the production of further electromagnetic signals and causing the field strength to saturate at about 50,000 volts per meter. The strength of the E1 pulse depends upon the number and intensity of the gamma rays produced by the weapon. The strength of the E1 pulse is, to a lesser extent, also dependent upon the altitude of the detonation of the nuclear device.

The interaction of the very rapidly moving negatively charged electrons with the magnetic field radiates a short duration, intense pulse of electromagnetic energy. The pulse typically rises to its peak magnitude in about five nanoseconds and decays to half of its peak value within two-hundred nanoseconds. By IEC definition, an E1 pulse ends within one microsecond after it begins.

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to act to suppress the surge induced into an electrical system by an E1 pulse.

The E2 component of the complex multi-pulse is generated by scattered gamma rays and inelastic gammas produced by neutrons emitted by the weapon. The E2 component is a pulse of intermediate time duration that, by IEC definition, lasts from about one microsecond to one second after the beginning of the electromagnetic pulse. The E2 component of the pulse has many similarities to an electromagnetic pulse produced by lightning, although the electromagnetic pulse induced by a very close lightning strike may be considerably larger than the E2 component of a nuclear EMP.

Because of the similarities to lightning-caused pulses and the widespread availability of lightning protection technology, the E2 pulse is generally considered to be the easiest to protect against. However, because an EMP produced by a nuclear weapon comprises a complex multi-pulse (i.e., the E1, E2, and E3 components), the primary potential problem with the E2 component is the fact that it immediately follows an E1 component which likely damaged any devices that were intended to protect against a lightning strike type surge that could have potentially protected against the E2 component pulse. As noted in the United States EMP Commission's Executive Report of 2004, referring to the E2 component pulse, "[i]n general, it would not be an issue for critical infrastructure systems since they have existing protective measures for defense against occasional lightning strikes. The most significant risk is synergistic, because the E2 component follows a small fraction of a second after the first component's insult, which has the ability to impair or destroy many protective and control features. The energy associated with the second component thus may be allowed to pass into and damage systems."

The E3 component of the complex multi-pulse is a very slow pulse, lasting tens to hundreds of seconds, caused by the nuclear detonation heaving the Earth's magnetic field out of the way, followed by the restoration of the magnetic field to its natural place. The E3 component has similarities to a geomagnetic storm caused by a very severe solar corona mass ejection (CME), or stellar-induced EMP's from stellar gamma ray burst sources, super novae, hypernovae and collisions of neutron stars. Similar to a geomagnetic storm, an E3 pulse can produce geomagnetically induced currents in long electrical conductors, which can then damage or destroy components such as power line transformers. The E3 induced currents are often called quasi-DC currents because by their long duration they more resemble a direct current from a battery rather than a short duration pulse. Nearly all of the damage from E3 in modern systems occurs to the AC power grid, which is generally not designed to handle direct currents, especially in critical devices such as power transformers which are ubiquitous in AC power distribution systems.

Figure 8:
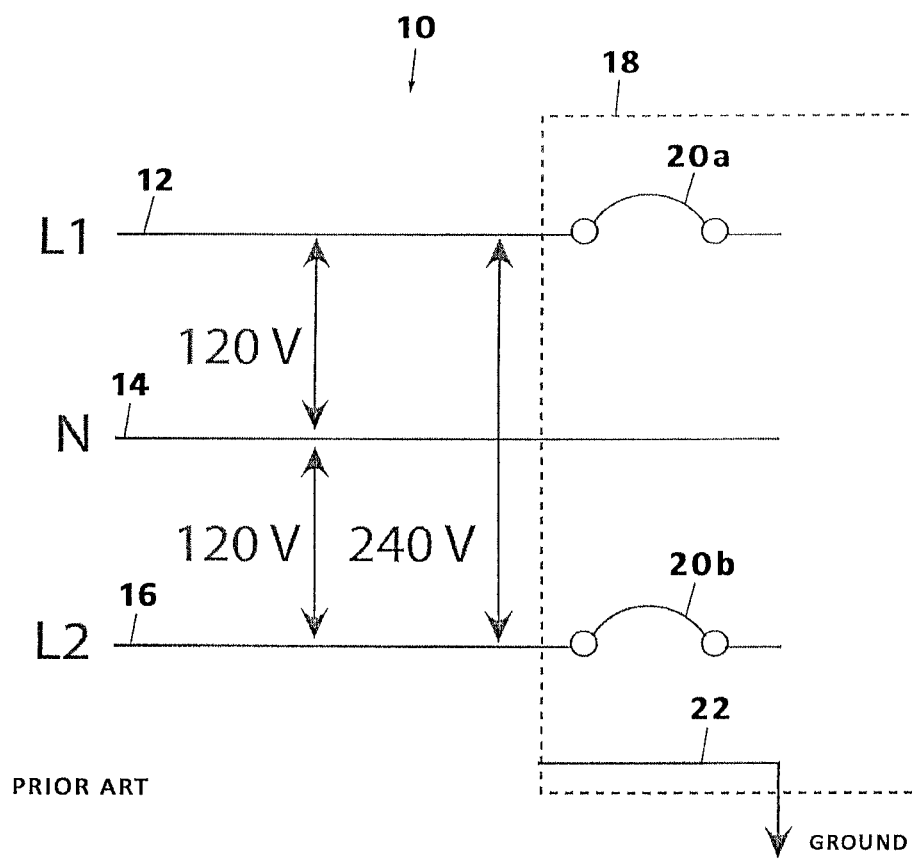
FIG. 8 is a schematic depiction of an exemplary prior art single-phase electrical system.

Now, looking first to FIG. 8, a schematic representation of a typical prior art single-phase electrical system, such as an electrical system for a house or residence, is depicted generally by the numeral 10. The electrical system comprises three power lines 12, 14, 16, providing electrical power into the house from an external power distribution grid. Power into the house is typically taken from a nearby transformer, such as a pole-mount or surface mount location. The lines entering the house 12, 14, and 16 typically include two power lines (12, 16), each carrying alternating current electricity at a potential of approximately 120 volts (with respect to neutral), and a neutral line (14) having a potential of approximately 0 volts. Such a power system is typically referred to as a 120/240 volt system, with the two power lines (12, 16), typically referred to as L1 and L2 lines, respectively, each providing 120 volts with respect to the neutral line, and providing 240 volts with respect to each other. Thus, the power system to the house provides two "legs" of 120 volt power, or 240 volts taken between the L1 and L2 lines.

The power lines 12, 16 from the external transformer are commonly directed into a breaker box 18 located inside the house and to a main circuit breaker (or breakers) 20*a*, 20*b* which protect against downstream overcurrent and allow a homeowner or service person to shut off the entering power. From the main circuit breaker(s) 20*a*, 20*b*, the electricity is typically distributed to a further series of circuit breakers which define electrical circuits within the house to which the electricity is distributed for powering lights, appliances, and the like.

A ground wire 22 attached to an earth ground, such as a buried conductive stake or buried conductive water line, is similarly routed into the breaker box to provide a ground path accessible within the breaker box. The ground wire is typically not provided from the external distribution grid as are the L1, L2, and neutral lines 12, 14, 16. Depending on the local building codes and the desired house electrical system configuration, the ground wire is often tied to the neutral line at the breaker box so that the neutral wire is nominally at ground potential at that location.

Figure 9:
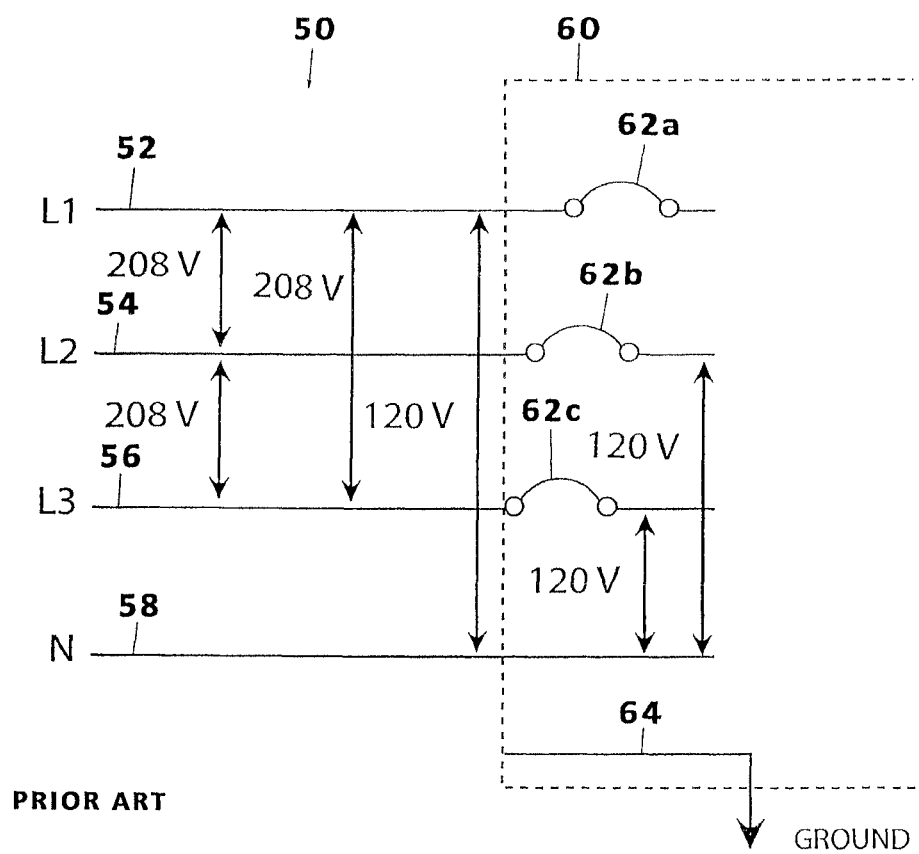
FIG. 9 is a schematic depiction of an exemplary prior art three-phase electrical system.

Looking to FIG. 9, a schematic representation of a typical prior art three-phase electrical system, such as an electrical system for a commercial building, is depicted generally by the numeral 50. The electrical system comprises four power lines 52, 54, 56, 58, providing electrical power into the building from an external power distribution grid. Power into the building is typically taken from a nearby transformer, such as a pole-mount or surface mount location. The lines entering the building 52, 54, 56, 58 typically include three power lines (52, 54, 56), each carrying alternating current electricity at a potential of approximately 120 volts (with respect to neutral), and a neutral line (58) having a potential of approximately 0 volts. Such a power system is typically referred to as a 208 volt 3 phase system, with the three power lines 52, 54, 56 typically referred to as P1, P2, and P3, lines, or Phase 1, Phase 2, and Phase 3 lines, and with the voltage between the various phases measuring 208 volts as the current on each of the phases is one-hundred and twenty degrees out of phase with the preceding and succeeding phase.

Similar to the single-phase system, the power lines 52, 54, 56, 58 from the external transformer in a three-phase system are commonly directed into a breaker box 60 located inside the building and into a main circuit breaker (or breakers) 62a, 62b, 62c which protect against downstream overcurrent and allow a service person to shut off the entering power. From the main circuit breaker(s) 62a, 62b, 62c, the electricity is typically distributed to a further series of circuit breakers which define electrical circuits within the building to which the electricity is distributed to power lights, equipment, and the like.

A ground wire 64 attached to an earth ground, such as a buried conductive stake or buried conductive water line, is similarly routed into the breaker box to provide a ground path within the breaker box. The ground wire is typically not provided from the external distribution grid as are the L1, L2, L3 and neutral lines 52, 54, 56, 58. Depending on the local building codes and the desired building electrical system configuration, the ground wire is often tied to the neutral line at the breaker box so that the neutral wire is nominally at ground potential at that location.

As just described, typical single-phase and three-phase land-based electrical systems in houses and commercial buildings receive power distributed through a power grid system comprising miles of interconnected wires and transformers distributing power across expansive geographical areas, with power transmission lines and wires typically strung between poles or buried relatively shallowly in the ground. The expansiveness of the power grid system makes it particularly susceptible to induced voltages and/or currents generated by a nuclear weapon detonated in proximity to any part of the power grid system, and facilitates the distribution of any such induced disturbances caused by the E1, E2, and E3 components of a nuclear EMP.

A three-phase electrical system is particularly relevant to the present invention to detect, isolate, and monitor an EMP and will be described in more detail later. However, to be complete, the figures also show characteristics of the E1, E2 and E3 components of an EMP.

Figure 10:
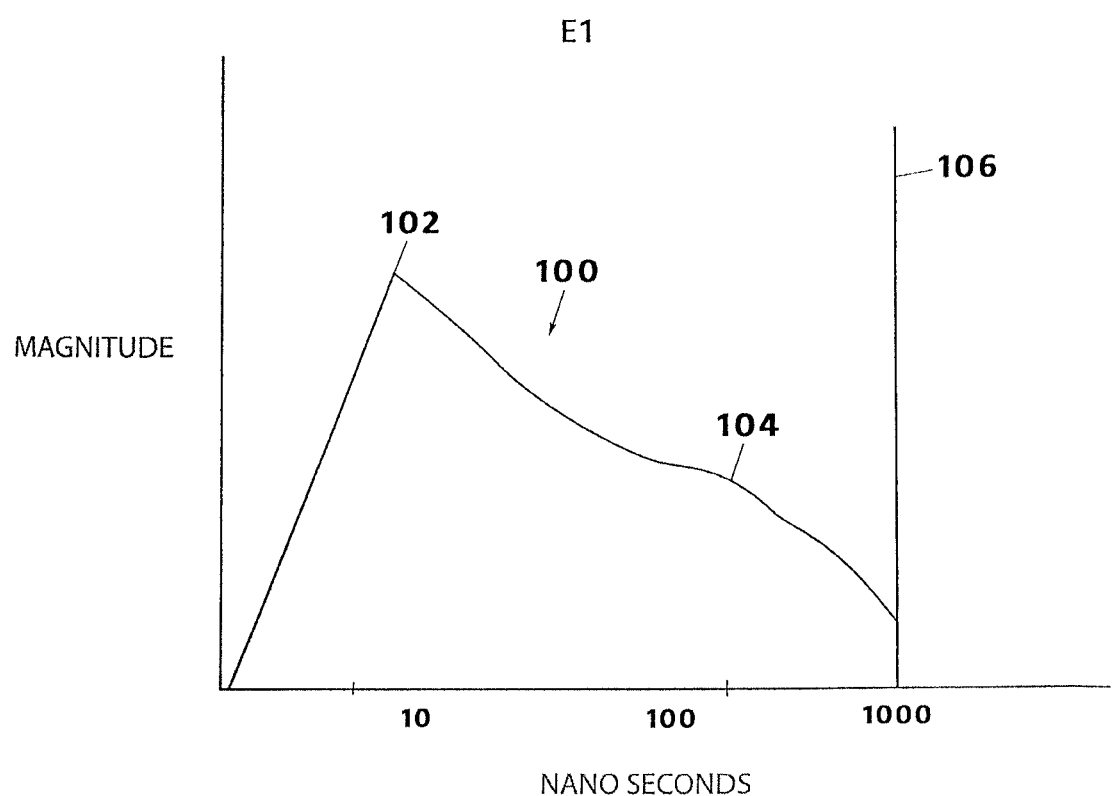
FIG. 10 is a graphical timing diagram representation of the E1 component of an exemplary EMP pulse.
Figure 11:
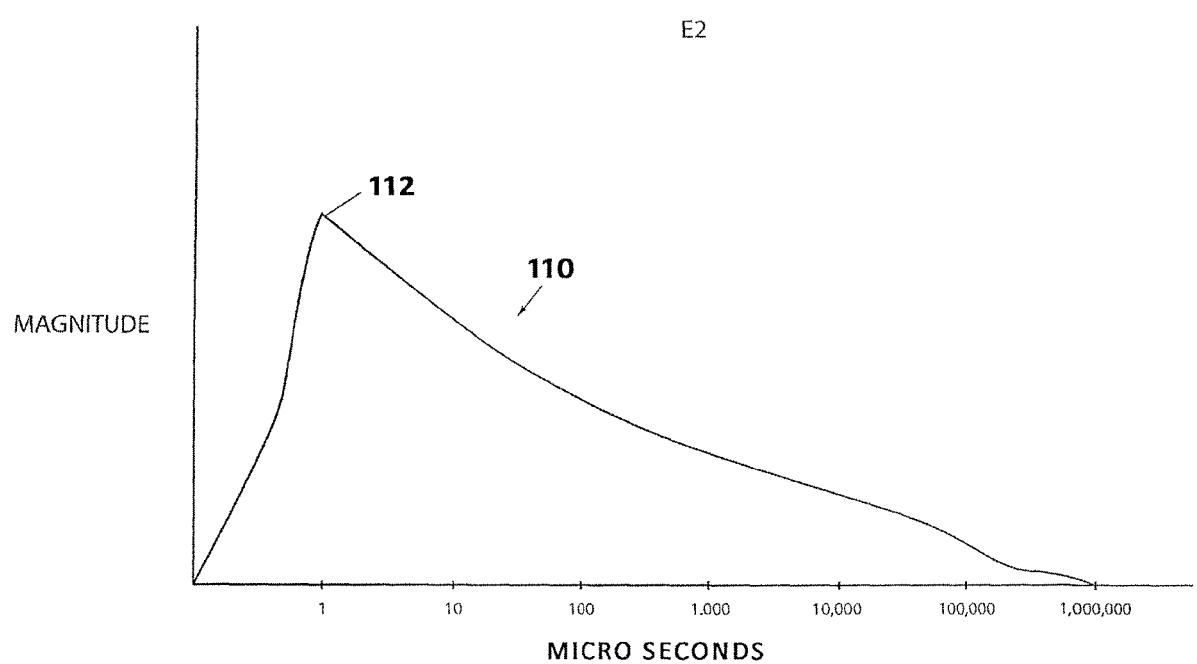
FIG. 11 is a graphical timing diagram representation of the E2 component of an exemplary EMP pulse.
Figure 12:
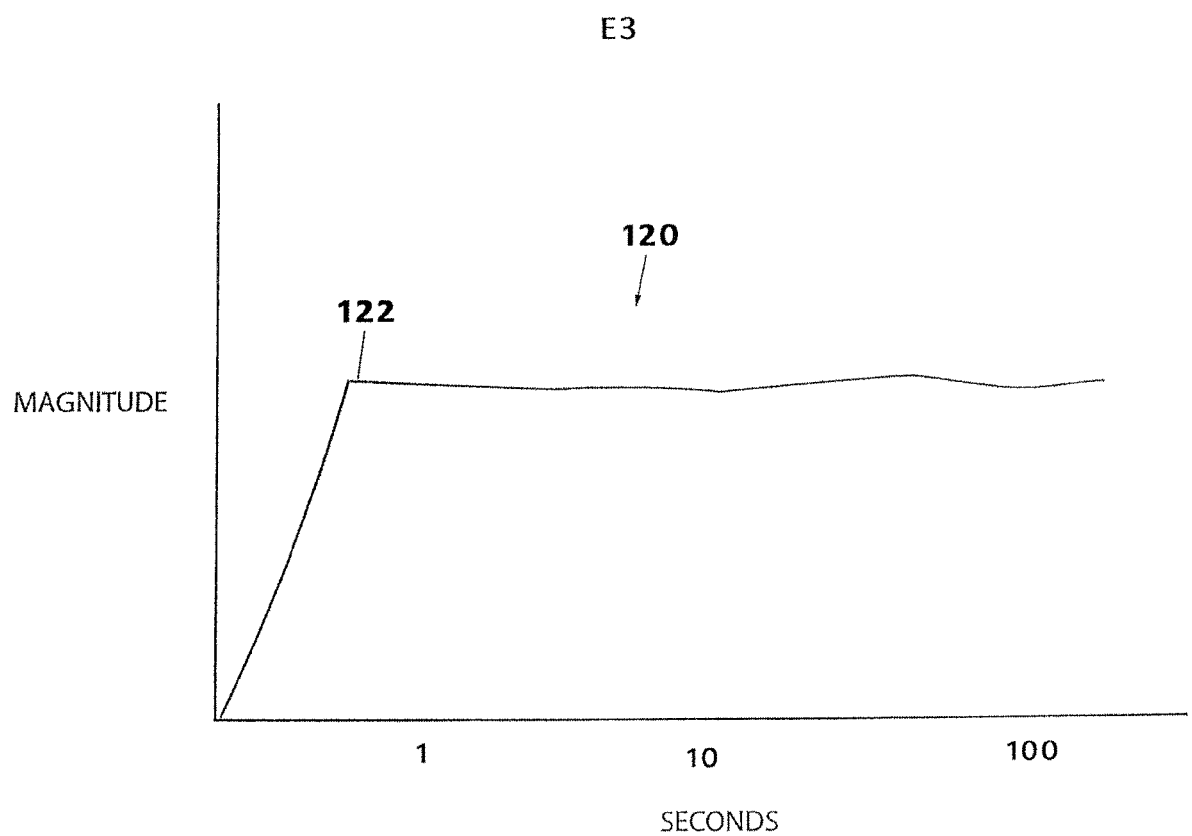
FIG. 12 is a graphical timing diagram representation of the E3 component of an exemplary EMP pulse.

Looking to FIG. 10 through 12, diagrams of the magnitude and timing of the three components, E1, E2, and E3 of the complex, multi-pulse EMP caused by a detonated nuclear weapon are depicted. It should be apparent to those skilled in the art that the timing diagrams present the elapsed time (x-axis) using a logarithmic scale. It should also be understood that the magnitude in the timing diagrams (y-axis) is not an absolute value, but represents the values of electromagnetic energy from a given reference or measurement point. For example, the peak magnitudes discussed with respect to the E1, E2, and E3 components below refer to the largest magnitude as measured from any given location with respect to the detonation point of the nuclear weapon, and that the peak value measured from a different location may be larger or smaller, depending on numerous factors including the distance from the detonation point. It should be further understood that regardless of the absolute peak value at any given measurement location that the shape and timing of the pulse will be essentially identical for any given measurement location. Furthermore, it should be understood that because the voltages induced into a power grid and/or electrical system by an EMP pulse are proportional to the magnitude of the electromagnetic energy introduced into the power grid, that the timing and shape of a timing diagram of the induced voltage will likewise be essentially identical to that of the electromagnetic energy diagram.

An E1 component pulse can be detected using electronic circuitry. Turning first to FIG. 10, and as discussed above, the E1 component pulse is a short duration, intense pulse of energy, depicted as numeral 100. As seen in the figure, the pulse rises to its peak magnitude 102 within about five nanoseconds, and decays to half of its peak value 104 within about two-hundred nanoseconds. As defined by the IEC, an E1 pulse ends 106 within one-thousand nanoseconds (i.e., one microsecond) from the time it begins.

Further, an E2 component pulse can be detected using electronic circuitry. Looking next to FIG. 4, and as discussed above, the E2 component is a pulse 110 of intermediate time duration, that reaches a peak 112 about one microsecond after the beginning of the electromagnetic pulse, with a duration typically less than one second. As also discussed above, the E2 component pulse 110 has many similarities to a pulse produced by a nearby lighting strike, with a relatively slow (as compared to the E1 component) rise time, and an intermediate duration (not more than about one second).

Finally, turning to FIG. 12, the E3 component pulse 120 can be detected by appropriate circuitry for its characteristic as a very slow pulse reaching a peak magnitude 122 and lasting tens to hundreds of seconds.

Now turning to FIG. 1 for a more detailed description of a preferred embodiment of the present invention, FIG. 1 illustrates three electrical lines 2, 4, 6 (also commonly referred to as electrical wires or phase wires) corresponding to the three phases of electricity entering an infrastructure, such as a commercial facility, electrical station, transformer, tower, or the like. Protection of an electrical tower 8 is shown in the drawings as an exemplary embodiment of the infrastructure being monitored and protected by the present invention (FIG. 1). An electrical device referred to generally as a phase unit 600, according to the present invention, may be electrically connected to each electrical line, respectively, upstream from the infrastructure to be protected and is electrically operable to detect an E1 component of an EMP, isolate a detected E1 component so as to protect the downstream infrastructure, or simply to monitor a pulse if the phase unit 600 determines an E1 component is not determined or is presently not conclusively determinable. Accordingly, the phase unit 600 may be referred to as a "DIME"—an acronym indicative of its functions of Detection, Isolation, and Monitoring of an Electromagnetic pulse. A phase unit 600 may be electronically connected to an electrical phase wire may be referred to as a phase DIME or a wire mounted DIME. Reference numeral 600 refers to a phase unit generically or to a plurality of phase units in general wherein the phase units used in a group of three according to an exemplary embodiment are referred as phase units 601, 602, and 603 a will be apparent below and in the drawings. The phase DIMEs are configured electronically and operable to provide an autonomous phase by phase detection and isolation to ensure that a single failure within a phase unit does not prevent the preferred functions of the other phase DIMEs. In the preferred embodiment, then three phase units 601, 602, 603 are electrically connected to the three phase wires 2, 4, 6, respectively, upstream from the infrastructure being monitored and protected.

Each phase unit 601, 602, 603 receives electricity data signals via a sensor 601*b*, 602*b*, 603*b*, respectively, monitoring a respective phase line to which it is electrically coupled. The act of data collection is identified by reference numeral 503 in FIG. 2. It is from these received signals that detection of an EMP can be made as described below.

In addition, another phase unit may be positioned at the base of the infrastructure being protected, e.g. an electrical tower 8, upstream of the infrastructure and displaced from a wire-mounted phase unit 600 (i.e. from a phase DIME). A phase unit positioned at the base of a tower may be referred to as a "base DIME", base unit 610, or "tower-based DIME" (and may be used interchangeably and with same reference numeral) and has an operability that is substantially similar to that described above for a phase unit, i.e. to detect, isolate, and monitor an electromagnetic pulse. It is understood that each phase DIME is configured to transmit signals to a corresponding base DIME and each base DIME is configured to receive said transmitted signals, such as using transmitter-receiver technologies, respectively, which are known in the art or, alternatively, using hardwire connectivity. The base unit 610 is advantageous as it is configured to confirm the operability of the wire-connected phase units 600 and otherwise provide a failsafe backup thereof.

Further, a base DIME 610 includes circuitry configured to provide detection and monitoring functions as well as being operable as a monitoring collection point of data collected from each phase DIME 600. In addition, the base DIME 610 also includes electronics for actuating an alert if an E1 pulse is detected. The base DIME 610 receives monitoring input from all of the corresponding phase units 601, 602, 603 and may transmit this data to a central location such as via a high frequency antenna, cellular signal, radio signal, Internet connection, or the like. And, as indicated above, a base DIME 610 is configured to determine if a line based phase unit 600 (i.e. a phase DIME) is malfunctioning. In addition, it is preferred that both the phase DIMEs and base DIME collects electrical data via DC sensors. The sensors for collecting electrical signal data may be positioned within the same casing as the electronics of the phase unit 600 described herein.

Figure 7:
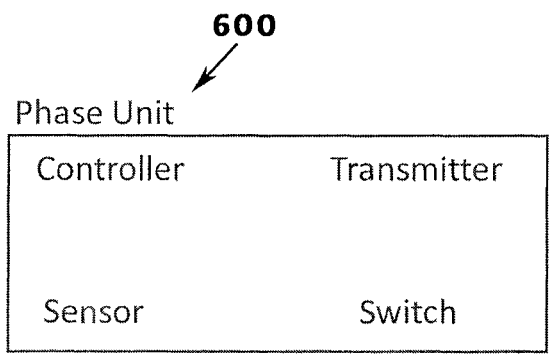
FIG. 7 is a block diagram illustrating the electronic components of a phase DIME unit.

The internal components of a phase unit 600 (i.e. a phase DIME) are shown in FIG. 7. It will be understood that a phase unit 600 and a base unit 610 (e.g. a phase DIME and a base DIME) may actually include the same electronic components yet be configured to function differently; for instance, a controller or circuitry may be configured or programmed to transmit, receive, or actuate in different ways depending on whether installed on a phase wire or at the base of a tower.

Now, it is appropriate to follow where electrical data collected by each phase unit 600 and base unit 610 is sent. More particularly, signals and data collected from the phase units 601, 602, 603 is transmitted to an associated base unit 610. This data and data actually generated by the associated base DIME (e.g. received signal data from the phase DIMEs) and additional data indicative of functionality of the phase units 600 is preferably transmitted to the offsite (remote) facility (e.g. to a remote server). The offsite location may also be referred to as a "central location" although its geographic location may not be critical. Preferably, the data transmittal described above is by cellular signal via a mobile phone data network although transmittal via wires, the internet, high frequency antenna, or even a satellite network may also work. The data received by the remote location may be analyzed, monitored, and acted on although the algorithm to do so may itself be proprietary and may remain undisclosed at present.

With further reference to the phase units 601, 602, 603 and base unit 610, the functions of the phase units 601, 602, 603 (e.g. a phase DIME) and base units (e.g. a tower DIME) have similarities and differences. More particularly, each phase unit 600 (electrically installed on the phase lines, respectively) is operable to detect an electrical signal (e.g. detect an EMP), to monitor electrical current flowing toward the infrastructure to be protected, and to actuate isolation of a respective phase wire (i.e. to activate a switch 601*a*, 602*a*, 603*a*, respectively, such as a electromechanical relay, to disconnect a respective phase wire from the infrastructure to be protected (FIG. 1). Isolating a phase wire in this manner may also be referred to as the isolation subsystem of the inventive method and system described herein and referred to with reference numeral 507 in FIG. 2. However, each base DIME 610 is configured, such as with circuitry or software with programming, to transmit an alert signal to the central location if an E1 component of an EMP is detected in the detection step described above but is not configured to isolate a phase wire.

Figure 2:
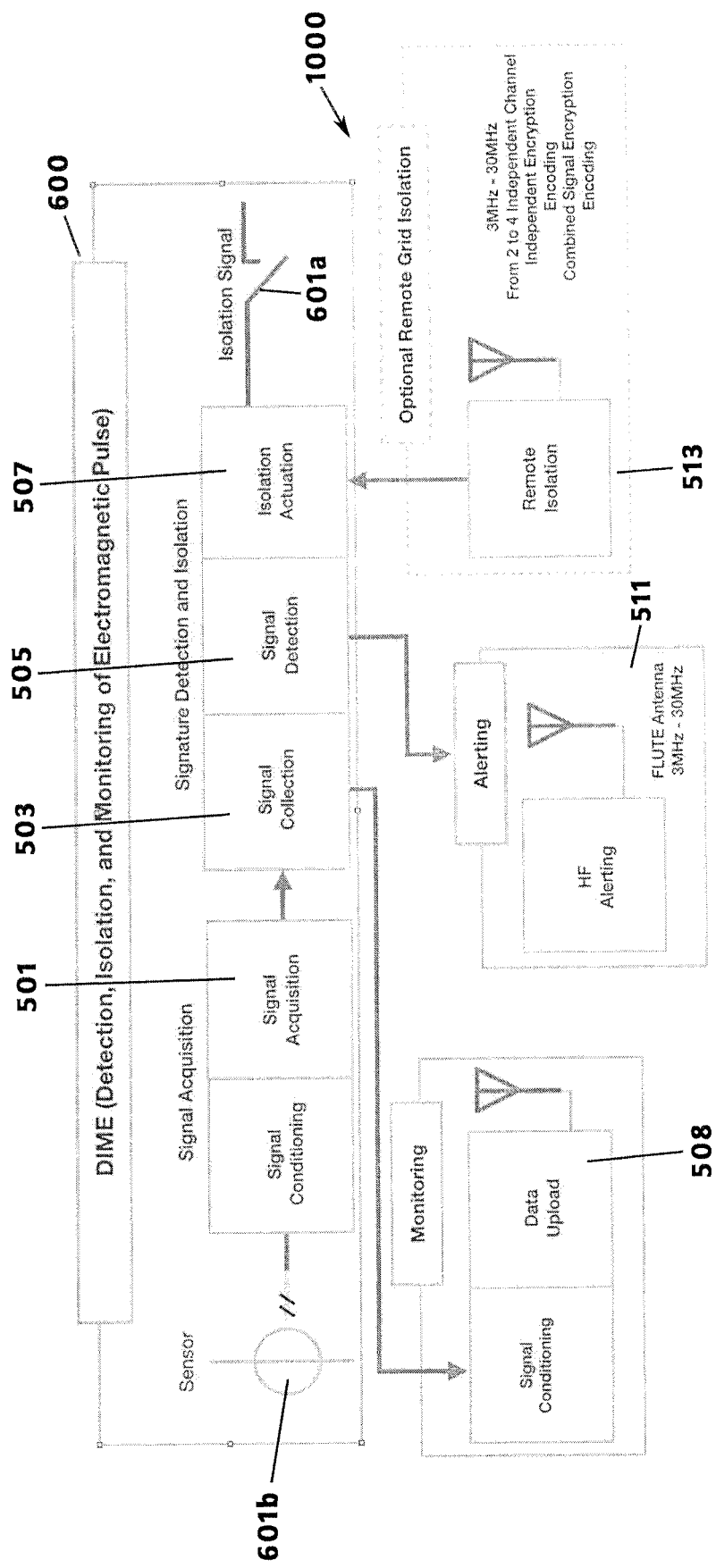
FIG. 2 is a block diagram of a system for detecting and isolating an electromagnetic pulse according to an exemplary embodiment of the present invention.
Figure 3:
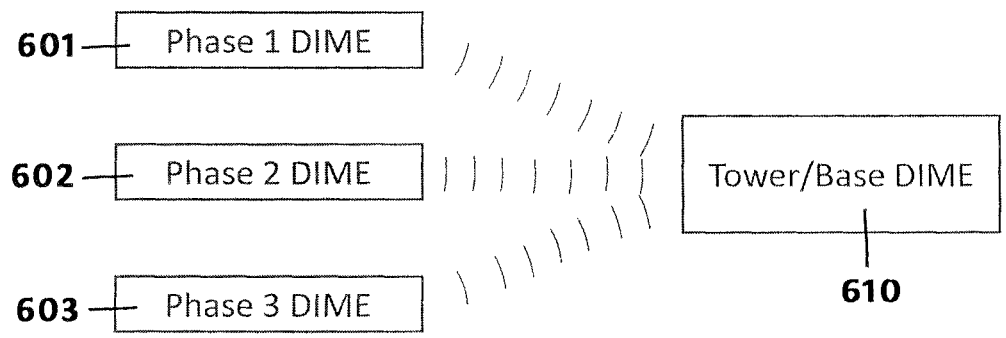
FIG. 3 is a block diagram illustrating operation of a portion of the system as in FIG. 1.

With further detail regarding signal collection and analysis, the present system 1000 collects electrical signal data experienced upstream of an infrastructure being monitored. It will be understood that "infrastructure" may refer to a transformer, a commercial enterprise, a government installation, or the like. The collection of electric signal data may also be referred to as receiving electric signal data from a plurality of sensors 601*b*, 602*b*, 603*b* associated with phase units 601, 602, 603, such as direct current sensors. Receiving and conditioning signals received from the sensors are referenced by reference numeral 501 and may be implemented by a an acquisition sub-subsystem. The action of collecting electrical signal data is illustrated at the block indicated by reference numeral 503 (FIG. 2).

Then, the collected signal data may be analyzed by a respective phase unit 600 and an E1, E2, or E3 component of an EMP may be detected based on its signature characteristic described previously. It is understood that incoming electricity may be sampled at a speed in excess of 1.0 GSPS (giga-samples per second) or, in other words at a very fast rate) and then be analyzed according to a proprietary Rate of Change (ROC) algorithm. The sampling time of a phase unit 600 is configurable. The means for detecting an EMP and, more particularly, an E1, E2, and E3 component of an EMP, is described both above and below, especially as illustrated in a three-phase electrical system. A ROC greater than a predetermined amount may be indicative of an E1 component of an EMP. The action of a phase unit 600 or base DIME 610 detecting an EMP is illustrated in FIG. 2 at the block using reference numeral 505.

Then, only the phase units 601, 602, 603 include circuitry configured to actuate an isolation of an associated phase wire and this action is illustrated at the block using reference numeral 507. For instance, if an E1 component is detected on the first phase wire 2, then the phase unit 601 associated with (i.e. continuously sampling) that phase wire 2 will be isolated by the propriety logic within less than 300 nanoseconds by causing actuation of a respective switch 601a (FIG. 1). It is understood that phase units 601, 602, 603 include associated switches 601a, 602a, 603a, respectively, configured to break contact with phase lines 2, 4, 6, respectively, when actuated. If no E1 component of an EMP is detected, the circuit of a phase unit 600 (phase DIME) or base DIME 610 merely continues to monitor the phase line as will be shown and described later with reference to FIG. 4 which illustrates the invention methodology. Continuing with reference to FIG. 2, a base DIME 610 is configured, such as with circuitry or software with programming, to upload the monitoring data (i.e. signal data from the phase units 600 and from the base DIME 610 itself) to the central location or remote server as is shown at the block shown with reference numeral 509. The transfer of monitoring data may be accomplished using a cellular network as indicated previously. Further, the action of sending an alert signal described above is shown at the block associated with reference numeral 511.

Figure 4:
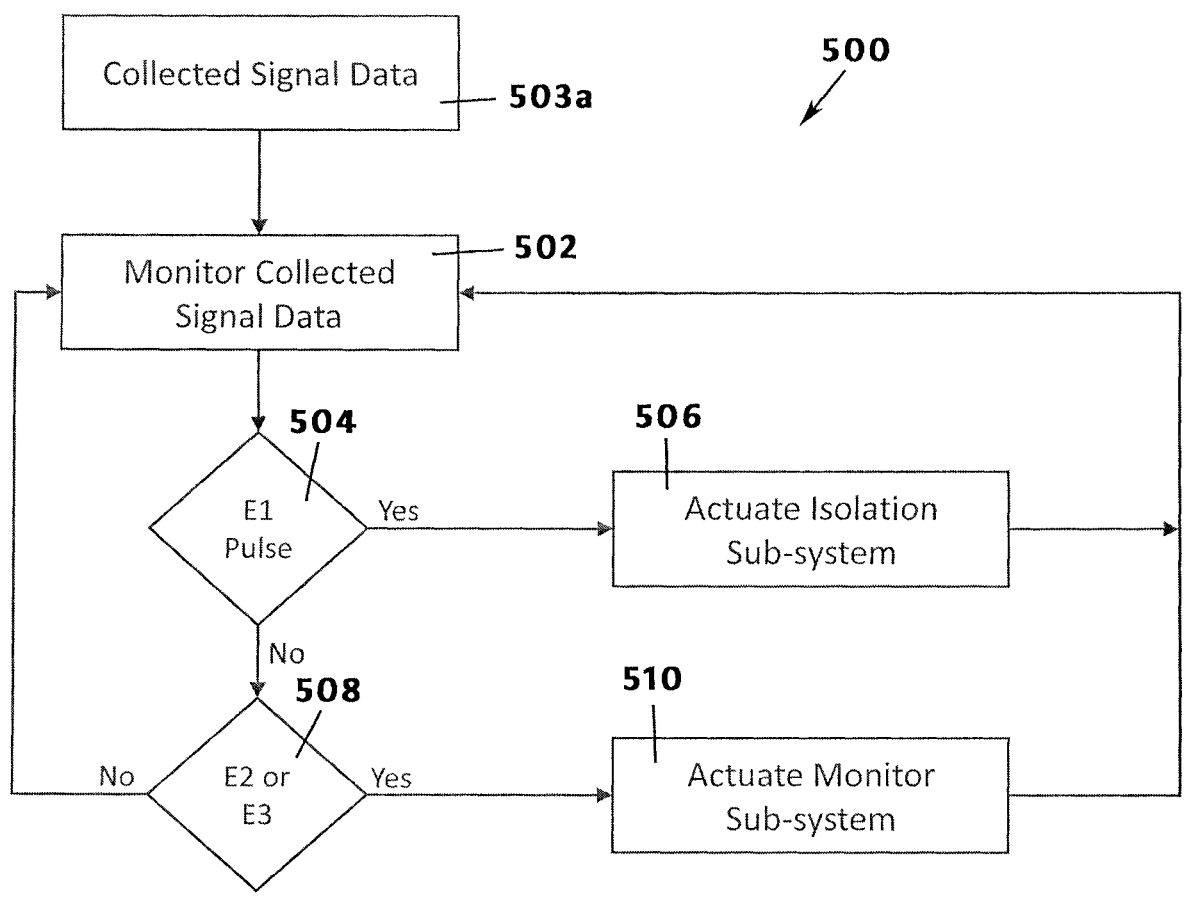
FIG. 4 is a flowchart illustrating the methodology of a process for detecting and isolating an electromagnetic pulse according to an exemplary embodiment of the present invention.
Figure 5:
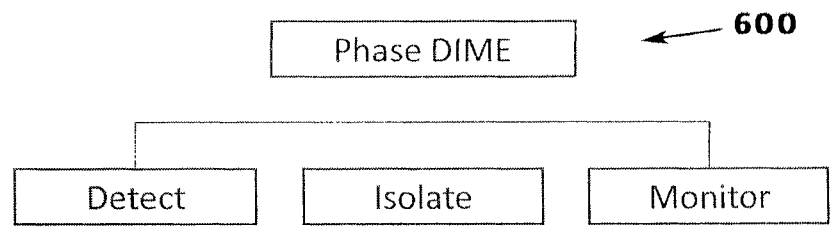
FIG. 5 is a block diagram illustrating the functions of a phase DIME unit according to the present invention.
Figure 6:
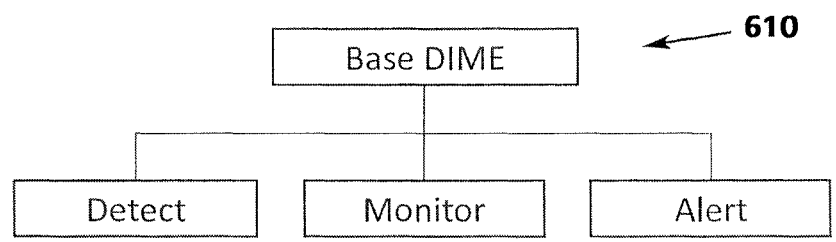
FIG. 6 is a block diagram illustrating the functions of a base DIME unit according to the present invention.

Turning to FIG. 4, received signal data is analyzed by a respective phase DIME 600 and base DIME 610 according to the DIME algorithm which is referred to in this application as process 500. Although the fixed logic of electronic components and direct electrical connections (i.e. the proprietary logic) is preferred for its speed of operation, it is understood that process 500 may be executed by computer software stored in a non-volatile memory and being executed by a processor or may include combinations of electrical components in cooperation with a microcontroller or processor. In other words, the discussion of software control is useful for clarity of the method, process, and logic illustrated herein. The DIME electronic components, whether utilizing hardware and software (or both), may be housed in the DIME unit, respectively. Signal data associated with electricity flowing downstream toward the electrical system of an infrastructure is collected as shown at 503a and analyzed and the process 500 proceeds to step 502 where received signals are monitored and which may be referred to as a monitoring subsystem. As explained above, an E1 component of an EMP has a detectable frequency, i.e. a signature. It may also have a rate of change (ROC) greater than a predetermined signature amount. At step 504, a processor, controller, or other electronic circuitry (preferred) determines if the received analyzed signal is indicative of an E1 component of an EMP and, if so, the process 500 proceeds to step 506. At step 506, the process 500 (via the proprietary logic) will actuate an isolation sub-system operable to isolate the associated infrastructure. As described, isolation involves the mechanical function of a respective phase unit actuating a switch to physically break the flow of electricity from a respective phase wire to the monitored infrastructure. Process 500 may return control to step 502 for continued monitoring of signal data.

With reference again to step 504, if an E1 component signature is not detected from a continuously monitored electrical signal, then control is passed to step 508. At step 508, the process analyzes if the collected signal has the characteristics of an E2 or E3 component and, if so, proceeds to step 510; otherwise, control returns to step 502 and the process 500 starts over. The characteristics of an E2 and an E3 component of an EMP are detectable based on the signal frequency of the collected signal, the details of which are described below. At step 510, the process 500 simply actuates a continued monitoring of continuously collected signal data and the process 500 returns control to step 502. The steps related to monitoring as described above may be referred to as carried out by a monitoring subsystem or process.

Optionally, the present method and system for detecting, isolating, and monitoring an EMP for the protection of an infrastructure may also include a remote isolation sub-system or module 513 (FIG. 2). The remote isolation sub-system receives an encoded message divided among multiple encoded channels operating in the 3 MHz-30 MHz band. The multiple channels are independently encoded at the remote location and independently decoded by the remote isolation sub-system The multiple decoded message fragments are combined in the complete message. The complete message is then decoded by the remote isolation sub-system and upon a valid remote isolation command, provides a trigger to the isolation actuation module, resulting in an isolation signal to the protected equipment. In other words, the remote isolation module 513 is configured to allow an infrastructure being monitored and protected to be isolated from a remote location, i.e. the central location remote from the infrastructure and with or without any determination of an EMP. For instance, one or more infrastructures may be taken offline of respective electricity grids if an E1 component has been detected by other phase units that are nearby or even if regional or national authorities suspect an EMP may be imminent. In such instances, a high frequency and possibly encrypted signal may be transmitted by the remote isolation module 513 (i.e. by the remote facility) to the phase units 601, 602, 603 associated with a selected infrastructure.

The means by which the E1, E2, and E3 components of an EMP are detected will now described in more detail below. As is apparent in the E1, E2, and E3 component timing diagrams of FIGS. 10 through 12, the complex multi-pulse of an EMP generated by a detonated nuclear weapon presents multiple pulses having varying timing signatures which cannot all be suppressed using known surge suppression devices. In another aspect of the present invention, a multi-phase EMP event may be completely suppressed (also referred to as being "shunted" by a properly protected infrastructure location as will be described below.

Figure 13:
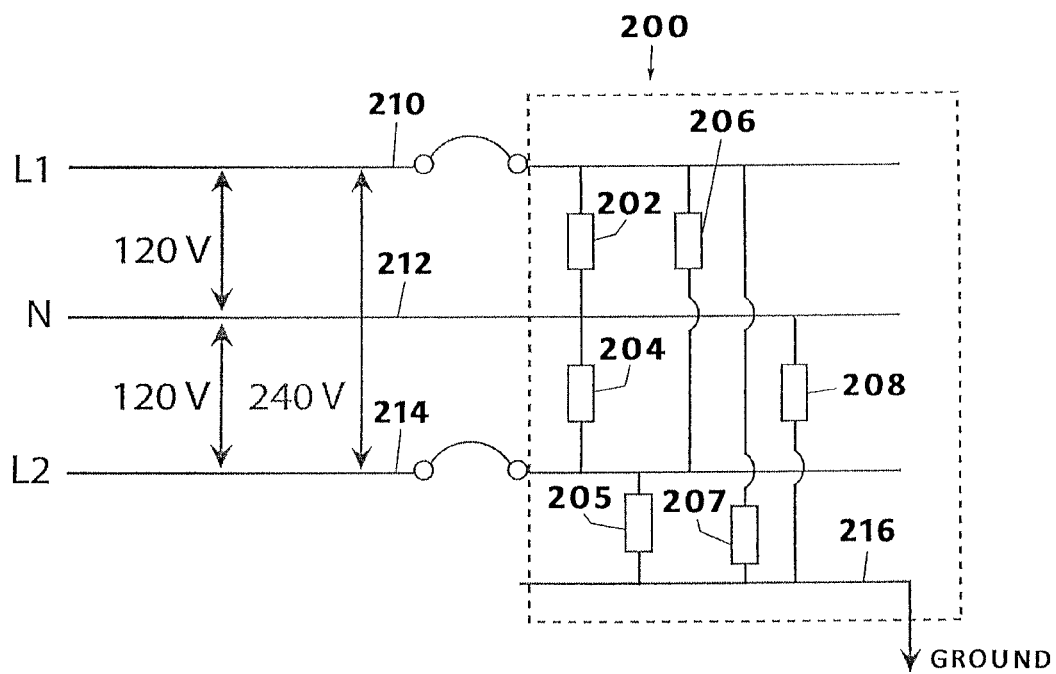
FIG. 13 is a schematic diagram of an exemplary embodiment a suppression feature of the present invention for use with a typical single-phase electrical system.

In another aspect of the invention and looking to FIG. 13, an embodiment of the invention having the additional function of actually suppressing an EMP generated by detonation of a nuclear weapon is depicted generally by the numeral 200, shown connected to a typical single-phase electrical system as described previously with respect to FIG. 8.

The system 200 comprises a plurality of shunt assemblies 202, 204, 205, 206, 207, 208 connected between various combinations of power lines. A shunt assembly may also be referred to merely as a "shunt". Shunt assembly 202 is connected between L1 (210) and neutral (212); shunt assembly 204 is connected between L2 (214) and neutral (212), shunt assembly 206 is connected between L1 (210) and L2 (214); and shunt assembly 208 is connected between neutral (212) and ground (216). Shunt assembly 205 is connected between L2 (214) and ground (216), and shunt assembly (207) is connected between L1 (210) and ground (216). The system 200 is preferably installed in or nearby the circuit breaker box typically used with a single-phase system as described above.

Each shunt assembly 202, 204, 205, 206, 207, 208 is properly called an "assembly" in that it comprises a plurality of shunt devices, such as metal-oxide varistors (MOVs), gas discharge tubes, and combinations thereof, as well as other mechanical, electrical and ionization discharge devices. Each shunt assembly 202, 204, 205, 206, 207, 208 most preferably includes a shunt device and/or combination of shunt devices having varying reaction times and voltages, configured and operable to react to one or more of the E1, E2, and E3 components of the EMP pulse.

For example, each of shunts 202, 204, 205, 206, 207, 208 preferably include: a combination of MOVs, gas discharge tubes, or other mechanical, electrical and ionization discharge devices or other shunt components configured to react to, and shunt, an overvoltage pulse having the characteristics of an E1 component pulse, a combination of MOVs, gas discharge tubes, or other mechanical, electrical and ionization discharge devices or other shunt components configured to react to, and shunt, an overvoltage pulse having the characteristics of an E2 component pulse, and a combination of MOVs, gas discharge tubes, or other mechanical, electrical and ionization discharge devices or other shunt components configured to react to, and shunt, an overvoltage pulse having the characteristics of an E3 component pulse. Preferably the MOVs, gas discharge tubes, other mechanical, electrical and ionization discharge devices and/or other shunt components are configured to detect and protect against line-to-line, common mode, line-to-neutral, and line to ground overvoltage events. In one exemplary embodiment the device is further configured to protect and shunt neutral to ground over-voltages.

Continuing the example, each shunt comprises combinations of MOVs, gas discharge tubes, other mechanical, electrical and ionization discharge devices and/or other shunt components operable to shunt each of the E1, E2, and E3 component pulses and to react to the timing of the pulses as set forth in FIGS. 10 through 12. Most preferably, the configuration of MOVs, gas discharge tubes, other mechanical, electrical and ionization discharge devices and/or other shunt components have ratings and characteristics allowing them to react and shunt over-voltages in compliance with military specification MIL-STD-188-125-1. Preferably, the MOVs, gas discharge tubes, other mechanical, electrical and ionization discharge devices or other shunt components are rated to shunt the E1, E2, and E3 components with minimal degradation such that the system 200 remains operable to protect the electrical system after multiple shunt incidents.

In one exemplary embodiment, the components of system 200 (i.e., the MOVs, gas discharge tubes, other mechanical, electrical and ionization discharge devices and/or other shunt components) and any other associated circuitry and wiring are assembled onto a printed circuit board and enclosed within a case for mounting in proximity to a breaker box where power lines from a power grid enter a house or building as depicted in FIG. 8. In further embodiments, the system 200 and associated circuitry and wiring is encased in a potting material, such as an epoxy resin.

Figure 14:
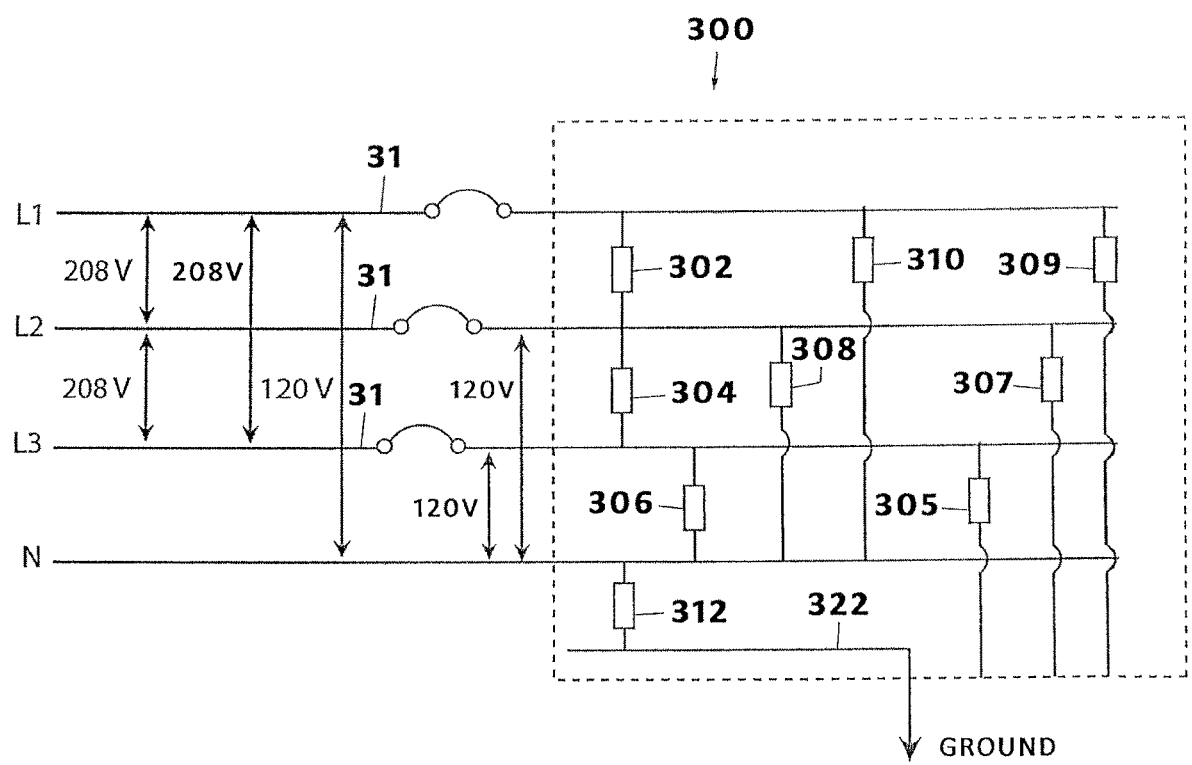
FIG. 14 is a schematic diagram of an exemplary embodiment of a suppression feature of the present invention for use with a typical three-phase electrical system.
Figure 15:
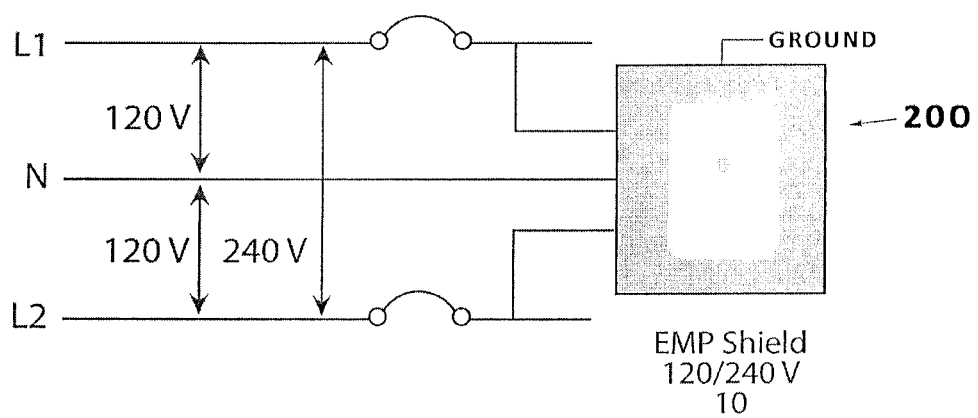
FIG. 15 is a schematic diagram of an embodiment of a suppression feature of the present invention in use with a typical single-phase electrical system.

Looking to FIG. 14, similar to the system 200 just described with respect to FIG. 9, a system 300 for suppressing an EMP generated by detonation of a nuclear weapon is depicted shown connected to a typical three-phase electrical system as described previously with respect to FIG. 13.

The system 300 comprises a plurality of shunts 302, 304, 305, 306, 307, 308, 309, 310, and 312 connected between various combinations of power lines (and ground and neutral) in a manner similar to that described above for a single-phase system. As also previously described each shunt comprises a plurality of shunt devices, including metal-oxide varistors (MOVs), gas discharge tubes, other mechanical, electrical and ionization discharge devices and combinations thereof, with each shunt including a shunt device and/or combination of shunt devices having varying reaction times and voltages, configured and operable to react to one or more of the E1, E2, and E3 components of the EMP pulse.

In a manner substantially similar to the system 300 described above, the thresholds and component configuration may be modified to support protection of a US 277/480 three phase power supply. The system would appear identical to the system 300 above, but would have overvoltage and over-current thresholds supporting the higher voltages of the 277/480 operating voltages as opposed to the 120/208 operating voltages described in the system 300 above. This modified system 300 embodiment will detect and protect against line to line, line to neutral, line to ground, and neutral to ground over-voltages/over-currents.

In a manner substantially similar to the system 300 described above, the thresholds and component configuration may be modified to support protection of a European Union common three-phase electrical supply of 400 volts at 50 Hz. The system would appear identical to the system 300 above, but would have overvoltage and overcurrent thresholds supporting the higher voltages of the 240/400 operating voltages as opposed to the 120/208 operating voltages described in the system 300 above. This modified system 300 embodiment will detect and protect against line to line, line to neutral, line to ground, and neutral to ground over-voltages/over-currents.

Likewise, each shunt comprises combinations of MOVs, gas discharge tubes, other mechanical, electrical and ionization discharge devices and/or other shunt components operable to shunt each of the E1, E2, and E3 component pulses and to react to the timing of the pulses as set forth in FIGS. 10 through 12. Most preferably, the configuration of MOVs, gas discharge tubes, other mechanical, electrical and ionization discharge devices and/or other shunt components have ratings and characteristics allowing them to react and shunt over-voltages in compliance with military specification MIL-STD-188-125-1.

Figure 16:
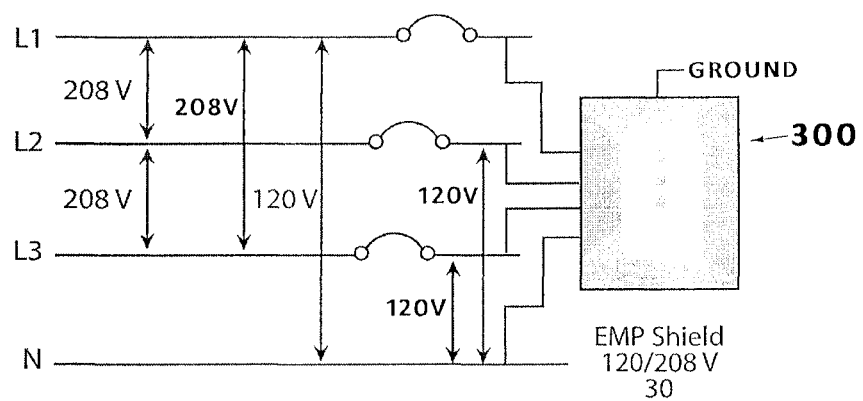
FIG. 16 is a schematic diagram of an embodiment of an exemplary encased system of the present invention in use with a typical three-phase electrical system.

In one exemplary embodiment, the components of system 300 (i.e., the MOVs, gas discharge tubes, other mechanical, electrical and ionization discharge devices and/or other shunt components) and any other associated circuitry and wiring are assembled onto a printed circuit board and enclosed within a case for mounting in proximity to a breaker box where power lines from a power grid enter a house or building as depicted in FIG. 16. In further embodiments, the system 300 and associated circuitry and wiring is encased in a potting material, such as an epoxy resin.

In an embodiment for suppression of an EMP-type electrical surge, the exemplary systems 200 and 300 as just described are operable to suppress an EMP pulse (comprising E1, E2, and E3 component pulses) as follows. Within less than one nanosecond of detection of an overvoltage exceeding a first E1 predetermined threshold on any one of a plurality of power lines, shunting the overvoltage to a neutral or ground to diminish the magnitude of the voltage level to below a second E1 predetermined threshold using one or more MOVs, one or more gas discharge tubes, or other mechanical, electrical and ionization discharge devices or combinations thereof. Simultaneously with detection and shunting of a fast duration E1 component pulse, detecting an intermediate duration E2 component pulse as being above a first E2 predetermined threshold level and, in less than a micro-second, shunting the second over-voltage using a combination of MOVs, gas discharge tubes, other mechanical, electrical and ionization discharge devices and/or other shunt components to less than a second E2 predetermined threshold level. Simultaneously, the system detects a long duration E3 component pulse as being above a first E3 predetermined threshold level and, within about one second, shunting the third over-voltage using a combination of MOVs, gas discharge tubes, other mechanical, electrical and ionization discharge devices and/or other shunt components to a second E3 predetermined threshold level.

In one exemplary embodiment, the MOVs, gas discharge tubes, other mechanical, electrical and ionization discharge devices and/or other shunt components used to detect and shunt the E1, E2, and E3 components, respectively, are separate, in other exemplary embodiments the MOVs, gas discharge tubes, and/or other shunt components used to detect and shunt the E1, E2, and E3 components have at least some commonality wherein one or more of the MOVs, gas discharge tubes, other mechanical, electrical and ionization discharge devices and/or other shunt components are used in the detection and shunting of one or more of the E1, E2, and E3 component events.

In use, the additional module and circuitry for suppressing electromagnetic pulse-induced electrical system surges can be used to protect the electrical grid and grid components (i.e. transformers, substations, wiring, insulators, and associated hardware). Initially, the shunting devices described herein may be positioned and installed on the power originating side of each fuse, each shunting device including metallic-oxide varistors ("MOVs"), gas discharge tubes, other mechanical, electrical, and ionization discharge devices). Upon sensing a surge in voltage or over-current above a predetermined level, the system is operable to shunt the over-voltage or over-current condition through the fuse (i.e. to trip the breaker, blow the fuse, or otherwise ground the current). Accordingly, the transformer or substation is isolated from the grid, which also isolates it from the "antenna" (i.e. grid wiring), disabling the ability for the potential electrical current to pass through the transformer or substation, the build-up of heat within the transformer or substation is eliminated thereby eliminating or reducing any damage to the transformer or substations itself.

Figure 17:
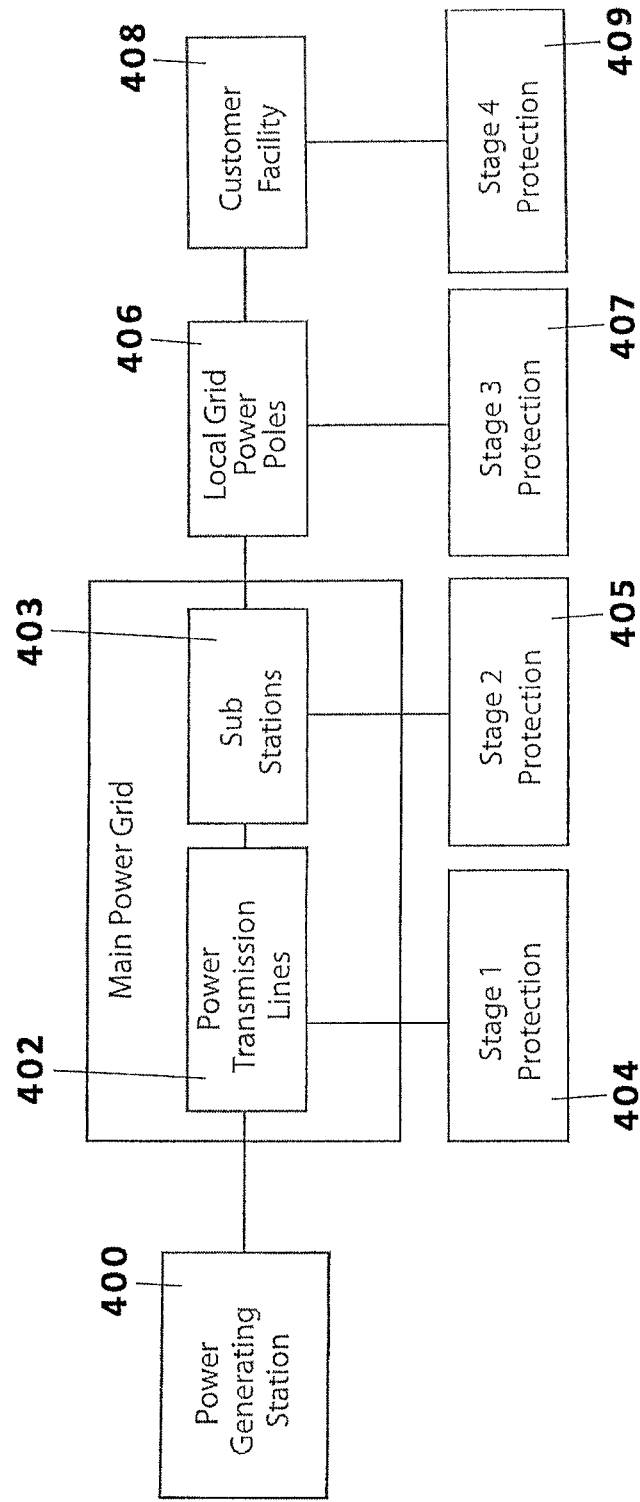
FIG. 17 is a block diagram illustrating operation of the system according to an embodiment of the present invention.

The multiple locations at which the assemblies described herein may be installed to protect electric systems as described herein are best understood with reference to the block diagram shown in FIG. 17. Electricity may be generated at a power generating station 400 such as at an electric, nuclear, hydroelectric plant, or the like. Next, generated electricity may be transferred via long distance or cross-country power transmission lines 402 such as the long and heavy lines seen stretching over mountain peaks, from Canada to the United States, and the like. Electricity is transferred at very high voltages and with high efficiency. The shunting devices described herein may be installed upstream of respective power transmission lines 402 so as to isolate them from electromagnetic pulses and this is referred to as Stage 1 Protection 404. Next, the voltage of transferred electricity may be reduced at respective substations 403 where the transferred electricity may be split up and diverted to regional areas and installing the shunting devices of the present invention upstream of these substations 403 is referred to as Stage 2 Protection 405.

Next, electricity may be directed through a local power grid, such as via electricity lines seen between the power poles 406 of a municipality, i.e. a town. Installing the present invention at this level is referred to as Stage 3 Protection 407. Finally, voltage is again reduced and delivered via a transformer to a customer facility 408 such as a residence or commercial facility. The shunting devices described above may be installed upstream of a respective meter or power box adjacent or inside the residence or building and this protection is known as Stage 4 Protection 409.

Accordingly, it can be seen that installing the system and devices described above to respective fuses at each transformer or substation from the initial power station downstream to every end user, all of the transformers and substations used to make up the overall electrical grid can be isolated from the wiring that makes up the grid. In other words, utilizing the system described above at every home, business, or facility that uses electricity will result in those locations being protected from damaging and disabling surges (i.e. the E1, E2, and E3 spikes) and any subsequent surges generated from feed wiring to the end-user facility and from within the end-user facility wiring.

Therefore, it can be seen that the system and method of the present invention are well-suited to detect, isolate, monitor, and alert when respective components of an EMP are detected and, in some embodiments, can actually suppress electrical surges and over-voltages induced by the detonation of a nuclear weapon, and the associated E1, E2, and E3 complex multi-pulse generated by that detonation. It will be appreciated that the system and method described above and recited in the claims below is functional in a substantially similar manner to shunt the electromagnetic pulses induced by a solar storm. For instance, a coronal mass ejection is a sun eruption of super-hot plasma that spews charged particles across the solar system and may induce currents in the electrical grid, overheating of transformers and causing mass failure within the electrical grid.

Many different arrangements and configurations of the system described and depicted, as well as components and features not shown, are possible without departing from the scope of the claims below. Likewise, variations in the order of the steps of the method described, as well as different combinations of steps, are within the scope of the present invention. Embodiments of the technology have been described with the intent to be illustrative rather than restrictive. Alternative embodiments will become apparent to readers of this disclosure after and because of reading it. Alternative means of implementing the aforementioned can be completed without departing from the scope of the claims below. Identification of structures as being configured to perform a particular function in this disclosure and in the claims below is intended to be inclusive of structures and arrangements or designs thereof that are within the scope of this disclosure and readily identifiable by one of skill in the art and that can perform the particular function in a similar way. Certain features and sub-combinations are of utility and may be employed without reference to other features and sub-combinations and are contemplated within the scope of the claims.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described.

What is claimed is:

1. A method for detecting and isolating an electromagnetic pulse ("EMP") along first phase, second phase, and third phase electrical lines electrically connected to a monitored infrastructure so as to protect the monitored infrastructure, said method for detecting and isolating comprising:
- a phase unit receiving electric signal data from a sensor electrically connected individually to each of the first phase, second phase, and third phase electrical lines, respectively, upstream of and associated with the monitored infrastructure;
- determining if said received electric signal data associated with said respective electrical line is indicative of an E1 component of an EMP and, if so, actuating an isolation subsystem in less than 300 nanoseconds to electrically isolate said respective electrical line against electrical communication with the monitored infrastructure and, if not, continuing to monitor said received electric signal data;
- wherein said determining if said received electric signal data associated with said respective electrical line is indicative of an E1 pulse includes repeatedly sampling said received electrical signal data at a predetermined rate of giga-samples-per-second (GSPS) and determining, based on said sampling, if a rate-of-change (ROC) exceeds a predetermined ROC.

2. The method for detecting and isolating as in claim 1, wherein said actuating the isolation subsystem operable to electrically isolate said respective electrical line includes physically disconnecting said respective electrical line from electrical communication with the monitored infrastructure.

3. The method for detecting and isolating as in claim 1, wherein said sensor includes a direct current sensor installed upstream of the monitored infrastructure.

4. The method for detecting and isolating as in claim 1, further comprising:
- transmitting said received electric signal data to a base unit associated with said phase unit; and
- said base unit receiving said transmitted received electric signal data.

5. The method for detecting and isolating as in claim 1, wherein said determining if said received electric signal data associated with said respective electrical line is indicative of an E1 pulse includes analyzing if a timing and shape of a timing diagram associated with said received electric signal data is indicative of a timing and shape of a timing diagram associated with an E1 component of an EMP.

6. A method for detecting and isolating an electromagnetic pulse ("EMP") along first phase, second phase, and third phase electrical lines electrically connected to a monitored infrastructure so as to protect the monitored infrastructure, said method for detecting and isolating comprising:
- a phase unit receiving electric signal data from a sensor electrically connected individually to each of the first phase, second phase, and third phase electrical lines, respectively, upstream of and associated with the monitored infrastructure; and
- determining if said received electric signal data associated with said respective electrical line is indicative of an E1 component of an EMP and, if so, actuating an isolation subsystem in less than 300 nanoseconds to electrically isolate said respective electrical line against electrical communication with the monitored infrastructure and, if not, continuing to monitor said received electric signal data;
- wherein said determining if said received electric signal data associated with said respective electrical line is indicative of an E1 component of an EMP includes determining if said received electric signal data is indicative of a pulse that rises to a peak magnitude within five nanoseconds or less, and decays to half of its peak value within two-hundred nanoseconds.

7. The method for detecting and isolating as in claim 1, wherein said determining if said received electric signal data associated with said respective electrical line is indicative of an E2 component of an EMP includes analyzing if a timing and shape of a timing diagram associated with said received electric signal data is indicative of a timing and shape of a timing diagram associated with an E2 component of an EMP.

8. The method for detecting and isolating as in claim 4, wherein said determining if said received electric signal data is indicative of an E2 component of an EMP includes determining if said received electric signal data is indicative of a pulse that rises to a peak magnitude within one micro-second and has a total a duration of less than one second.

9. The method for detecting and isolating as in claim 1, wherein said determining if said received electric signal data is indicative of an E3 component of an EMP includes analyzing if a timing and shape of a timing diagram associated with said received electric signal data is indicative of a timing and shape of a timing diagram associated with an E3 component of an EMP.

10. The method for detecting and isolating as in claim 1, further comprising:
- transmitting said received signal data associated with a respective electrical line to an infrastructure base unit positioned upstream of and associated with said monitored infrastructure,
- said infrastructure base unit determining if said received electric signal data associated with said respective electrical line is indicative of an E1 component of an EMP and, if so, actuating the isolation subsystem in less than 300 nanoseconds to electrically isolate said respective electrical line against electrical communication with the monitored infrastructure.

11. The method for detecting and isolating as in claim 10, further comprising:
- said infrastructure base unit transmitting said received signal data to a third party facility that is remote from said monitored infrastructure; and
- said infrastructure base unit transmitting an alert signal to said third party facility if said received signal data is determined to be indicative of an E1 pulse associated with said respective electrical line.

12. The method for detecting and isolating as in claim 1, further comprising said infrastructure base unit determining, using said received electric signal data, if said received electric signal data is not indicative of an E1 component of the EMP but is indicative of an E2 or E3 component of the EMP and, if so, actuating a monitoring subsystem.

13. A method for detecting and isolating an electromagnetic pulse ("EMP") along first phase, second phase, and third phase electrical lines electrically connected to a monitored infrastructure so as to protect the monitored infrastructure, said method for detecting and isolating comprising:
- a phase unit receiving electric signal data from a sensor electrically connected individually to each of the first phase, second phase, and third phase electrical lines, respectively, upstream of and associated with the monitored infrastructure; and
- determining if said received electric signal data associated with said respective electrical line is indicative of an E1 component of an EMP and, if so, actuating an isolation subsystem in less than 300 nanoseconds to electrically isolate said respective electrical line against electrical communication with the monitored infrastructure and, if not, continuing to monitor said received electric signal data; and within less than one nanosecond after said detecting that said received electric signal data is indicative of an E1 component of an EMP, shunting an overvoltage on said electric lines of the infrastructure to decrease the level of said overvoltage to a predetermined threshold level using a first shunting assembly including MOVs, gas discharge tubes, other mechanical, electrical and ionization discharge devices and combinations thereof.

14. A system for detecting and isolating an electromagnetic pulse ("EMP") along first phase, second phase, and third phase electrical lines electrically connected to a monitored infrastructure so as to protect the monitored infrastructure, said system for detecting and isolating, comprising:

a plurality of phase units having electronics operable to receive electric signal data from a sensor electrically connected individually to each of the first phase, second phase, and third phase electrical lines, respectively, upstream of and associated with the monitored infrastructure;

wherein each phase unit includes electronics for determining if said received electric signal data associated with said respective electrical line is indicative of an E1 component of an EMP and, if so, is configured to actuate an isolation subsystem in less than 300 nanoseconds to electrically isolate said respective electrical line against electrical communication with the monitored infrastructure and, if not, is configured to continue to monitor said received electric signal data;

wherein said phase unit is electronically configured to repeatedly sample said received electrical signal data at a predetermined rate of giga-samples-per-second (GSPS) and to determine, based on said sampling, if a rate-of-change (ROC) exceeds a predetermined ROC indicative of an E1 pulse.

15. The system for detecting and isolating as in claim 14, wherein said isolation subsystem is configured to isolate said respective electrical line by transmitting a signal to physically disconnect said respective electrical line from electrical communication with the monitored infrastructure.

16. The system for detecting and isolating as in claim 14, wherein said sensor includes a direct current sensor installed upstream of the monitored infrastructure.

17. The system for detecting and isolating as in claim 14, further comprising:

a transmitter electrically connected to said phase unit and operable to transmit said received electric signal data; and a receiver associated with an infrastructure base unit that is operable to receive said transmitted electric signal data.

18. The system for detecting and isolating as in claim 14, wherein said phase unit is electronically configured to determine if said received electric signal data associated with said respective electrical line is indicative of an E1 pulse by analyzing if a timing and shape of a timing diagram associated with said received electric signal data is indicative of a timing and shape of a timing diagram associated with an E1 component of an EMP.

19. A system for detecting and isolating an electromagnetic pulse ("EMP") along first phase, second phase, and third phase electrical lines electrically connected to a monitored infrastructure so as to protect the monitored infrastructure, said system for detecting and isolating, comprising:

a plurality of phase units having electronics operable to receive electric signal data from a sensor electrically connected individually to each of the first phase, second phase, and third phase electrical lines, respectively, upstream of and associated with the monitored infrastructure;

wherein each phase unit includes electronics for determining if said received electric signal data associated with said respective electrical line is indicative of an E1 component of an EMP and, if so, is configured to actuate an isolation subsystem in less than 300 nanoseconds to electrically isolate said respective electrical line against electrical communication with the monitored infrastructure and, if not, is configured to continue to monitor said received electric signal data;

wherein said phase unit is electronically configured to determine if said received electric signal data associated with said respective electrical line is indicative of an E1 component of an EMP by determining if said received electric signal data is indicative of a pulse that rises to a peak magnitude within five nanoseconds or less, and decays to half of its peak value within two-hundred nanoseconds.

20. The system for detecting and isolating as in claim 14, wherein said phase unit is electronically configured to determine if said received electric signal data associated with said respective electrical line is indicative of an E2 component of an EMP by analyzing if a timing and shape of a timing diagram associated with said received electric signal data is indicative of a timing and shape of a timing diagram associated with an E2 component of an EMP.

21. The system for detecting and isolating as in claim 14, wherein said phase unit is electronically configured to determine if said received electric signal data is indicative of an E2 component of an EMP by analyzing if said received electric signal data is indicative of a pulse that rises to a peak magnitude within one micro-second and has a total a duration of less than one second.

22. The system for detecting and isolating as in claim 14, wherein said phase unit is electronically configured to determine if said received electric signal data is indicative of an E3 component of an EMP by analyzing if a timing and shape of a timing diagram associated with said received electric signal data is indicative of a timing and shape of a timing diagram associated with an E3 component of an EMP.

23. The system for detecting and isolating as in claim 14, wherein:

said phase unit includes a transmitter and is electronically configured to transmit said received signal data associated with a respective electrical line to an infrastructure base unit positioned upstream of and associated with said monitored infrastructure;

said infrastructure base unit having electronics operable to determine if said received electric signal data associated with said respective electrical line is indicative of an E1 component of an EMP and, if so, to actuate in less than 300 nanoseconds an isolation subsystem to electrically isolate said respective electrical line against electrical communication with the monitored infrastructure.

24. The system for detecting and isolating as in claim 23, wherein:

said infrastructure base unit includes a transmitter configured to transmit said received signal data to a third party facility that is remote from said monitored infrastructure; and said infrastructure base unit is configured to transmit an alert signal to said third party facility if said received signal data is determined to be indicative of an E1 pulse associated with said respective electrical line.

25. The system for detecting and isolating as in claim 24, wherein said infrastructure base unit includes electronics operable to determine, using said received electric signal data, if said received electric signal data is indicative only of an E2 or E3 component of the EMP and, if so, is configured to actuate a monitoring subsystem.

26. A system for detecting and isolating an electromagnetic pulse ("EMP") along first phase, second phase, and third phase electrical lines electrically connected to a monitored infrastructure so as to protect the monitored infrastructure, said system for detecting and isolating, comprising:
- a plurality of phase units having electronics operable to receive electric signal data from a sensor electrically connected individually to each of the first phase, second phase, and third phase electrical lines, respectively, upstream of and associated with the monitored infrastructure;
- wherein each phase unit includes electronics for determining if said received electric signal data associated with said respective electrical line is indicative of an E1 component of an EMP and, if so, is configured to actuate an isolation subsystem in less than 300 nanoseconds to electrically isolate said respective electrical line against electrical communication with the monitored infrastructure and, if not, is configured to continue to monitor said received electric signal data;
- a first shunting assembly configured to shunt, within less than one nanosecond after detecting that said received electric signal data is indicative of an E1 component of an EMP, an overvoltage on said electric lines of the infrastructure to decrease the level of said overvoltage to a predetermined threshold level;
- wherein said shunting assembly includes MOVs, gas discharge tubes, other mechanical, electrical and ionization discharge devices and combinations thereof.

* * * * *